(12) United States Patent
Yasuda et al.

(10) Patent No.: US 10,848,150 B2
(45) Date of Patent: Nov. 24, 2020

(54) LOAD DRIVING DEVICE

(71) Applicant: ANDEN CO., LTD., Anjo (JP)

(72) Inventors: Naoyuki Yasuda, Anjo (JP); Manabu Morita, Anjo (JP)

(73) Assignee: ANDEN CO., LTD., Anjo (JP)

( * ) Notice: Subject to any disclaimer, the term of this patent is extended or adjusted under 35 U.S.C. 154(b) by 0 days.

(21) Appl. No.: 16/381,112

(22) Filed: Apr. 11, 2019

(65) Prior Publication Data

US 2019/0326905 A1 Oct. 24, 2019

(30) Foreign Application Priority Data

Apr. 23, 2018 (JP) ................................. 2018-082231

(51) Int. Cl.
| | |
|---|---|
| *H02P 7/03* | (2016.01) |
| *H03K 17/687* | (2006.01) |
| *H03K 17/082* | (2006.01) |

(52) U.S. Cl.
CPC .......... *H03K 17/6872* (2013.01); *H02P 7/04* (2016.02); *H03K 17/0822* (2013.01); *H03K 2217/0045* (2013.01)

(58) Field of Classification Search
CPC ...... H02P 1/00; H02P 1/04; H02P 1/26; H02P 1/24; H02P 1/46; H02P 3/00; H02P 3/12; H02P 3/18; H02P 7/00; H02P 21/00; H02P 23/00; H02P 27/00; H02P 27/04; H02P 27/06; H02P 7/04; G05B 11/28; H03K 17/6872; H03K 2217/0045; H01H 51/065; H02H 7/0838

USPC ............ 318/400.01, 400.14, 400.26, 400.27, 318/400.28, 400.29, 700, 701, 721, 779, 318/799, 800, 801, 280, 282, 286, 790; 334/10

See application file for complete search history.

(56) References Cited

U.S. PATENT DOCUMENTS

| | | | | |
|---|---|---|---|---|
| 6,315,418 | B1 * | 11/2001 | Tornare ................. | B60R 1/0602 296/146.1 |
| 6,497,303 | B1 * | 12/2002 | Nishimura ........... | B62D 5/0487 180/443 |
| 7,145,264 | B2 * | 12/2006 | Nagae ............... | B60R 25/02142 307/10.2 |
| 9,065,375 | B2 * | 6/2015 | Yanai ................... | B62D 5/0487 |

(Continued)

FOREIGN PATENT DOCUMENTS

| | | |
|---|---|---|
| JP | 09240437 A | 9/1997 |
| JP | 2005138672 A | 6/2005 |

(Continued)

*Primary Examiner* — Antony M Paul
(74) *Attorney, Agent, or Firm* — Harness, Dickey & Pierce, P.L.C.

(57) ABSTRACT

A load driving device includes an H bridge circuit that includes a first upstream switching element, a first downstream switching element, a second upstream switching element, a second downstream switching element, a first output terminal between the first upstream switching element and the second downstream switching element, and a second output terminal between the second upstream switching element and the first downstream switching element. A first load is connected between the first output terminal and the second output terminal, and a second load is connected between a ground potential point and one of the first output terminal and the second output terminal.

7 Claims, 4 Drawing Sheets

(56) References Cited

U.S. PATENT DOCUMENTS

| | | | |
|---|---|---|---|
| 9,702,419 B2 * | 7/2017 | Essenmacher | F16D 41/125 |
| 10,331,158 B2 * | 6/2019 | Matsunaga | H02J 3/383 |
| 2007/0068727 A1 * | 3/2007 | Miura | B62D 5/046 |
| | | | 180/446 |
| 2013/0063850 A1 | 3/2013 | Kawamoto et al. | |
| 2018/0126973 A1 * | 5/2018 | Choe | B60T 13/741 |

FOREIGN PATENT DOCUMENTS

| | | |
|---|---|---|
| JP | 2005186855 A | 7/2005 |
| JP | 2013-062976 A | 4/2013 |
| JP | 2017013595 A | 1/2017 |

* cited by examiner

LOAD DRIVING DEVICE

CROSS REFERENCE TO RELATED APPLICATION

The present application claims the benefit of priority from Japanese Patent Application No. 2018-082231 filed on Apr. 23, 2018. The entire disclosure of the above application is incorporated herein by reference.

TECHNICAL FIELD

The present disclosure relates to a load driving device.

BACKGROUND

Conventionally, a load driving device for driving a plurality of loads includes a plurality of load driving circuits corresponding to the number of loads. In other words, a load driving circuit that includes a wire harness for a current supply from a power source, a fuse, and a switch such as a relay is provided for each of the loads, and an electronic control unit (hereinafter referred to as a control ECU) controls on and off of the switch. By turning on and off the switch in each of the load driving circuits, the current supply to each of the loads is controlled independently.

SUMMARY

The present disclosure provides a load driving device that is configured to control operation of a first load and a second load, and includes an H bridge circuit or a relay circuit. The first load is connected between a first output terminal and a second output terminal of the H bridge circuit or the relay circuit, and the second load is connected between a ground potential point and one of the first output terminal and the second output terminal.

BRIEF DESCRIPTION OF DRAWINGS

Additional objects and advantages of the present disclosure will be more readily apparent from the following detailed description when taken together with the accompanying drawings. In the drawings.

DETAILED DESCRIPTION

Figure 1:
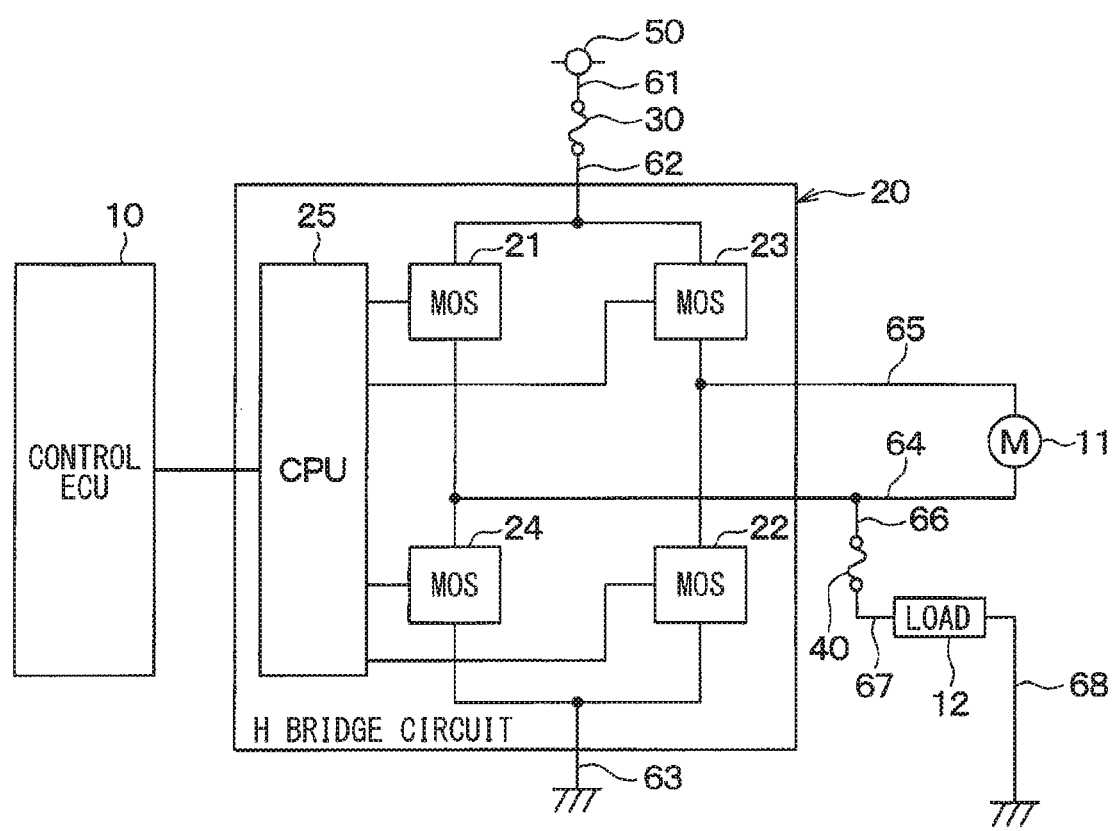
FIG. 1 is a diagram showing a circuit configuration of a load driving device according to a first embodiment.

In a case where a load driving device includes a plurality of load driving circuits corresponding to the number of loads, the number of parts is increased by the number of the load driving circuits. Thus, for example, even for a load with a low option ratio or a low operation ratio, it is necessary to provide a load driving circuit corresponding to the number of the load to realize the function of the load. As a result, it is necessary to secure a mounting area of the load driving device including the load driving circuits for the respective loads, and a weight increases due to equipping the load driving circuit for driving the load with the low operation ratio.

A load driving device according to an aspect of the present disclosure is configured to control operation of a first load and a second load and includes an H bridge circuit. The H bridge circuit includes a first upstream switching element, a first downstream switching element, a second upstream switching element, a second downstream switching element, a first output terminal between the first upstream switching element and the second downstream switching element, and a second output terminal between the second upstream switching element and the first downstream switching element. The first load is connected between the first output terminal and the second output terminal of the H bridge circuit. The second load is connected between a ground potential point and one of the first output terminal and the second output terminal. Note that, in the present disclosure, "one of the first output terminal and the second output terminal" means "the first output terminal or the second output terminal."

With such a configuration, the load driving device can control not only the operation of the first load but also the operation of the second load. Since various parts used for operating the first load are also used for operating the second load, the number of parts can be reduced. Therefore, the cost can be reduced and an increase in mounting area and weight of the load driving device can be restricted.

A load driving device according to another aspect of the present disclosure is configured to control operation of a first load and a second load and includes a relay circuit. The relay circuit includes a first switching relay, a second switching relay, a first output terminal, and a second output terminal. Each of the first switching relay and the second switching relay includes a switching switch having a first contact, a second contact, and a movable contact, and a solenoid connecting the movable contact to the first contact during a non-energizing time and connecting the movable contact to the second contact during an energizing time. The first output terminal is connected to the movable contact of the first switching relay. The second output terminal is connected to the movable contact of the second switching relay. The first load is connected between the first output terminal and the second output terminal of the relay circuit. The second load is connected between a ground potential point and one of the first output terminal and the second output terminal.

With such a configuration, the load driving device can control not only the operation of the first load but also the operation of the second load. Since various parts used for operating the first load are also used for operating the second load, the number of parts can be reduced. Therefore, the cost can be reduced and an increase in mounting area and weight of the load driving device can be restricted.

Hereinafter, embodiments of the present disclosure will be described with reference to the drawings. In the following embodiments, the same or equivalent parts are denoted by the same reference numerals.

First Embodiment

A first embodiment will be described. FIG. 1 is a circuit diagram showing a load driving device according to the present embodiment. Hereinafter, the load driving device according to the present embodiment will be described with reference to FIG. 1.

The load driving device shown in FIG. 1 controls operation of a motor 11 corresponding to a first load and a load 12 corresponding to a second load based on a control signal from a control ECU 10, and is mounted on a vehicle, for example.

The control ECU 10 is formed of an ECU such as a door ECU or a wiper ECU provided in the vehicle, and outputs a control signal to operate the load driving device based on, for example, a switch operation by a user.

The motor 11 is formed of a DC motor. For example, the motor 11 is rotated in a forward direction when an electric current flows in a first direction, and is rotated in a reverse direction when an electric current flows in a second direction opposite to the first direction.

The load driving device operates one or both of the motor 11 and the load 12 based on the control signal from the control ECU 10.

Specifically, the load driving device includes an H bridge circuit 20 for driving the motor 11 and fuses 30 and 40. The H bridge circuit 20 is controlled based on control signals from the control ECU 10. Accordingly, the operation of both the motor 11 and the load 12 are controlled.

The H bridge circuit 20 includes a forward rotation upstream MOS 21, a forward rotation downstream MOS 22, a reverse rotation upstream MOS 23, a reverse rotation downstream MOS 24, and a CPU 25. The H bridge circuit 20 is formed of, for example, a one-chip semiconductor integrated circuit. A circuit in which the forward rotation upstream MOS 21 and the reverse rotation downstream MOS 24 are connected in series and a circuit in which the reverse rotation upstream MOS 23 and the forward rotation downstream MOS 22 are connected in series are connected in parallel between a power source 50 and a ground potential point to form the H bridge circuit.

In addition, a high side of the H bridge circuit 20, that is, further upstream of the forward rotation upstream MOS 21 and the reverse rotation upstream MOS 23 is connected to the power source 50 via the fuse 30. The motor 11 is connected between both output terminals of the H bridge circuit 20, that is, between a first output terminal between the forward rotation upstream MOS 21 and the reverse rotation downstream MOS 24 and a second output terminal between the reverse rotation upstream MOS 23 and the forward rotation downstream MOS 22. In addition, the load 12 is connected between the first output terminal and the ground potential point via the fuse 40. Alternatively, the load 12 may be connected between the second output terminal and the ground potential point via the fuse 40. Furthermore, a low side of the H bridge circuit 20, that is, a downstream side of the forward rotation downstream MOS 22 and the reverse rotation downstream MOS 24 is connected to the ground potential point.

Each of the forward rotation upstream MOS 21, the forward rotation downstream MOS 22, the reverse rotation upstream MOS 23, and the reverse rotation downstream MOS 24 is a semiconductor switching element that is turned on and off based on the control signal from the CPU 25. The forward rotation upstream MOS 21, the forward rotation downstream MOS 22, the reverse rotation upstream MOS 23 and the reverse rotation downstream MOS 24 are configured to be turned on and off independently.

The CPU 25 outputs the control signals for controlling respective gate voltages of the forward rotation upstream MOS 21, the forward rotation downstream MOS 22, the reverse rotation upstream MOS 23 and the reverse rotation downstream MOS 24 to control on and off of each MOS. For example, the CPU 25 performs synchronization of on and off of the forward rotation upstream MOS 21 and the forward rotation downstream MOS 22, and the reverse rotation upstream MOS 23 and the reverse rotation downstream MOS 24, and controls so that the serially-connected two are not turned on simultaneously. Further, the CPU 25 can be provided with a current detection function so that an electric current flowing in the forward rotation upstream MOS 21 or the reverse rotation upstream MOS 23 can be detected by the CPU 25, for example.

The fuse 30 and the power source 50 are connected via a wire harness 61. The fuse 30 and the H bridge circuit 20 are connected via a wire harness 62. The low side of the H bridge circuit 20 is connected to the ground potential point via a wire harness 63. The first output terminal of the H bridge circuit 20 and one terminal of the motor 11 are connected via a wire harness 64, and the second output terminal and the other terminal of the motor 11 are connected via a wire harness 65. The wire harness 64 connected with the first output terminal and the fuse 40 are connected via a wire harness 66. The fuse 40 and one terminal of the load 12 are connected via a wire harness 67, and the other terminal of the load 12 is grounded via a wire harness 68.

Subsequently, operation of the load driving device according to the present embodiment will be described. Herein, each of a case where the motor 11 is rotated in the forward direction (hereinafter referred to as forward rotation operation), a case where the motor 11 is rotated in the reverse direction (hereinafter referred to as reverse rotation operation), and a case where only the load 12 is operated (hereinafter referred to as load operation) will be explained.

(1) Forward Rotation Operation

During the forward rotation operation, the forward rotation upstream MOS 21 and the forward rotation downstream MOS 22 are turned on, and the reverse rotation upstream MOS 23 and the reverse rotation downstream MOS 24 are turned off based on the control signals from the CPU 25. As a result, an electric current flows to the motor 11 in the first direction from the first output terminal to the second output terminal of the H bridge circuit 20, and the motor 11 is rotated in the forward direction.

Further, in the present embodiment, the load 12 is connected to the first output terminal of the H bridge circuit 20. Since the potential of the first output terminal becomes equal to the potential of the power source 50 during the forward rotation operation, an electric current is also supplied from the power source 50 to the load 12 so as to operate the load 12 simultaneously.

(2) Reverse Rotation Operation

During the reverse rotation operation, the reverse rotation upstream MOS 23 and the reverse rotation downstream MOS 24 are turned on, and the forward rotation upstream MOS 21 and the forward rotation downstream MOS 22 are turned off based on the control signals from the CPU 25. As a result, an electric current flows to the motor 11 in the second first direction from the second output terminal to the first output terminal of the H bridge circuit 20, and the motor 11 is rotated in the reverse direction.

During the reverse rotation operation, the potential of the second output terminal becomes the potential of the power source 50 while the potential of the first output terminal becomes the ground potential. Thus, an electric current is not supplied from the power source 50 to the load 12, and the load 12 is not operated.

(3) Load Operation

During the load operation, the forward rotation upstream MOS 21 and the reverse rotation upstream MOS 23 are turned on, and the forward rotation downstream MOS 22 and the reverse rotation downstream MOS 24 are turned off. As a result, an electric current is supplied from the power source 50 to the load 12 via the forward rotation upstream MOS 21 and the fuse 40, and the load 12 is operated.

In the present case, since both the forward rotation upstream MOS 21 and the reverse rotation upstream MOS 23 are turned on, both ends of the motor 11 have the same potential. Therefore, only the load 12 is operated, and the motor 11 can be restricted from rotating in the forward direction or in the reverse direction.

As described above, in the load driving device according to the present embodiment, the load 12 is connected between the motor 11 corresponding to the first load and one of the first output terminal and the second output terminal of the H bridge circuit 20.

As a result, the load drive device can control not only the operation of the motor 11 but also the operation of the load 12. Since various parts used for operating the motor 11 are also used for operating the load 12, the number of parts can be reduced. Therefore, the number of parts of at least a part of the load driving device can be reduced, and an increase in mounting area and weight of the load driving device can be restricted.

The effect of reducing the number of parts will be described specifically as compared with a load driving device according to a comparative example.

Figure 2:
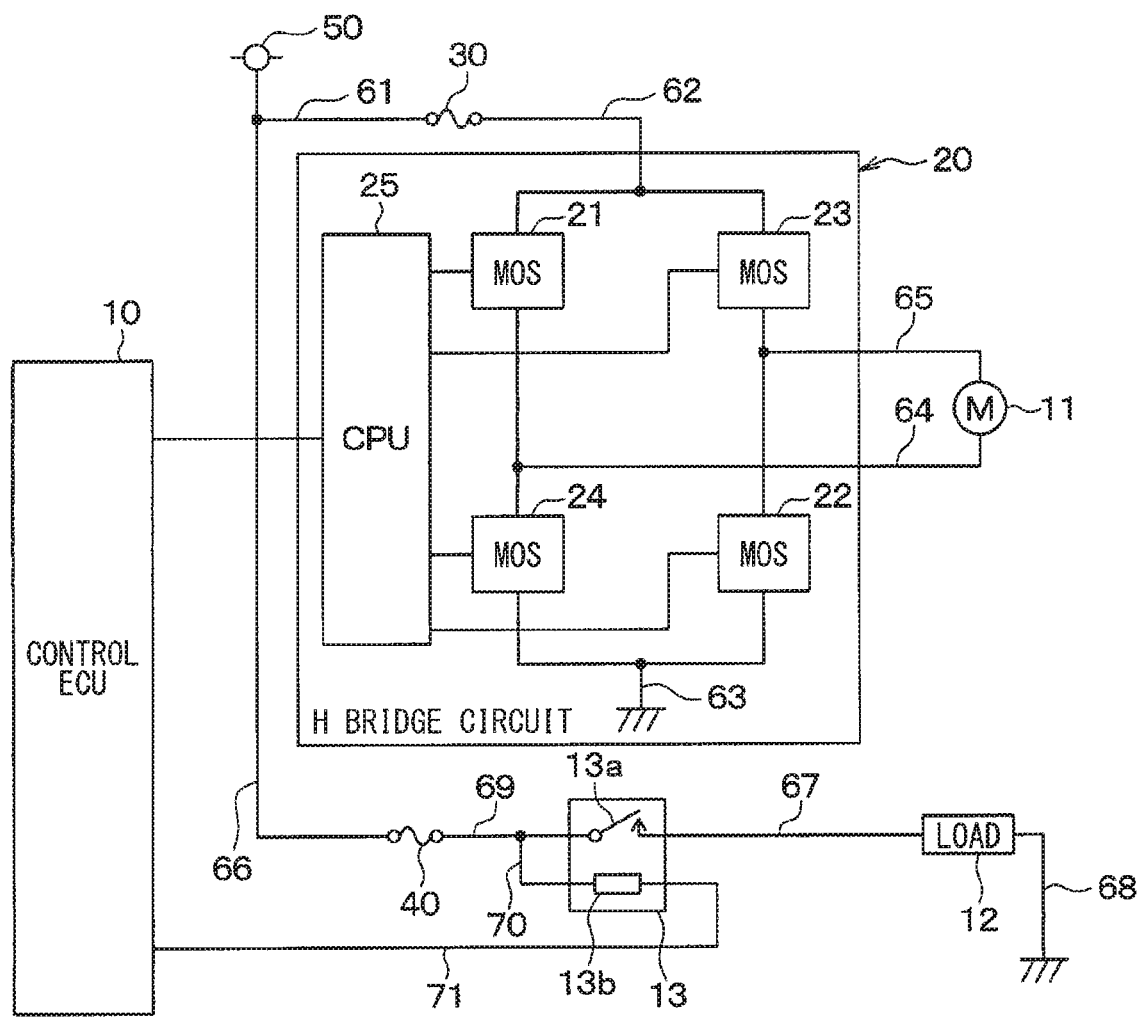
FIG. 2 is a diagram showing a circuit configuration of a load driving device according to a comparative example.

As shown in FIG. 2, in the load driving device according to the comparative example, the configurations of the H bridge circuit 20 and the motor 11 are similar to the configurations of the H bridge circuit 20 and the motor 11 in FIG. 1. However, a relay 13 for turning on and off the operation of the load 12 is provided. Thus, a wire harness 69 connecting the fuse 40 and one contact of a switch 13a of the relay 13, a signal line 70 connecting the fuse 40 and a solenoid 13b of the relay 13, and a signal line 71 connecting the solenoid 13b and the control ECU 10 are required.

Therefore, in the load driving device according to the present embodiment, in addition to elimination of the relay 13, the wire harness 69, the signal line 70 and the signal line 71 can also be eliminated as compared with the load driving device shown in FIG. 2. Further, for example, even when the load 12 has a low option ratio or a low operation ratio, it is not necessary to mount load driving circuits corresponding to the number of loads in order to realize the function. Accordingly, the mounting area of the load driving devices can be reduced, and the cost and the weight can be restricted.

In a case where the load 12 is connected to the first output terminal of the H bridge circuit 20, the load 12 is also operated when the motor 11 is rotated in the forward direction. Thus, the load 12 is limited to a load that does not cause a trouble even when the load is operated simultaneously with the motor 11.

Examples in which the above-described embodiment is specifically applied will be described.

Example 1

Figure 3:
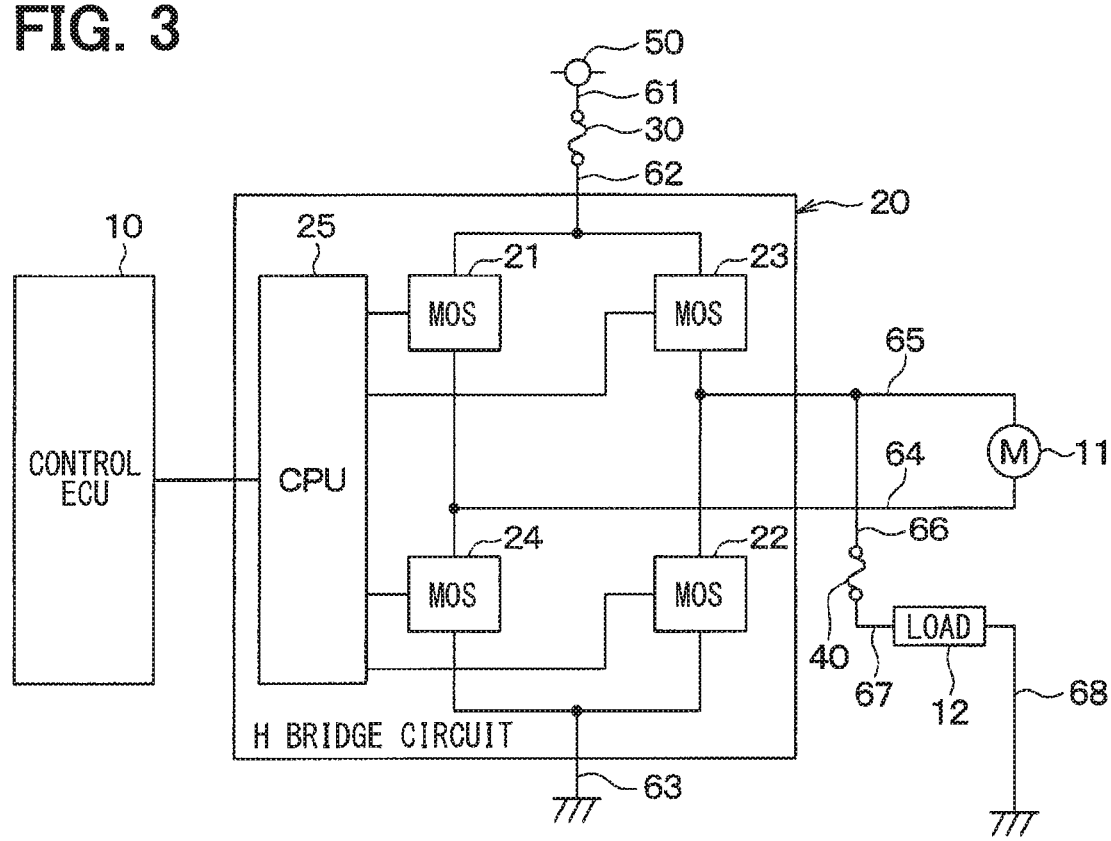
FIG. 3 is a circuit diagram showing a load driving device according to Example 1 of a first embodiment.

FIG. 3 is a circuit diagram of a load driving device according to Example 1. In the present example, a description will be given of a case where the motor 11 is applied as an electric folding motor when a door mirror is an electric folding mirror, and the load 12 is applied as a mirror heater used for defogging the door mirror. In the present case, the control ECU 10 corresponds to a door ECU, for example. The fuse 40 and the load 12 are connected to the second output terminal of the H bridge circuit 20.

When a folding switch (not shown) is pressed, for example, the electric folding mirror is controlled from an unfolded state to a folded state. Then, when the folding switch is pressed again from a depressed state and is released, the electric folding mirror is controlled from the folded state to the unfolded state.

In the present case, the forward rotation upstream MOS 21 and the forward rotation downstream MOS 22 are used as an unfolding upstream MOS and an unfolding downstream MOS which are turned on when the electric folding mirror is put in the unfolded state. The reverse rotation upstream MOS 23 and the reverse rotation downstream MOS 24 are used as a folding upstream MOS and a folding downstream MOS which are turned on when the electric folding mirror is put in the folded state.

Since the operation of the electric folding mirror to the unfolded state and the folded state is visible, if the electric folding mirror is operated when a user does not operate the folding switch, uncomfortable feeling may be given to the user. Therefore, the electric folding mirror is not operated when the folding switch is not operated by the user.

The mirror heater is used to heat a mirror portion for defogging when the electric folding mirror is fogged in the unfolded state. The mirror heater is disposed, for example, on a back side of the mirror portion, and is actuated when, for example, an operation switch (not shown) is pressed.

Since it is difficult for the user to grasp an operating state of the mirror heater, even if the mirror heater is operated when the operation switch is not pressed, uncomfortable feeling is not given to the user.

When the motor 11 and the load 12 are applied to the electric folding mirror and the mirror heater, the following operation is performed.

First, when the electric folding mirror is operated from the folded state to the unfolded state, the above-described "(1) Forward Rotation Operation" is performed. As a result, an electric current flows to the motor 11 in the first direction from the first output terminal to the second output terminal of the H bridge circuit 20, the motor 11 rotates in the forward direction, and the electric folding mirror is operated into the unfolded state. Since the load 12 is connected to the second output terminal of the H bridge circuit 20, an electric current is not supplied from the power source 50 to the load 12 at the time. Thus, the load 12 is not operated.

Next, when the electric folding mirror is operated from the unfolded state to the folded state, the above-described "(2) Reverse Rotation Operation" is performed. As a result, an electric current flows to the motor 11 in the second direction from the second output terminal to the first output terminal of the H bridge circuit 20, the motor 11 rotates in the reverse direction, and the electric folding mirror is operated into the folded state.

Since the load 12 is connected to the second output terminal of the H bridge circuit 20, an electric current is supplied from the power source 50 to the load 12 at the time. Therefore, the load 12 is also operated. However, as described above, in a case where the load 12 is the mirror heater, even if the load 12 is operated in a state where the operation switch is not depressed, uncomfortable feeling is not given to the user. Therefore, there is no problem even if the load 12 is operated at the same time when the electric folding mirror is operated into the folded state.

When the load 12 is grounded, the fuse 40 is blown, so that the current supply to the load 12 is interrupted. Even at this time, since the motor 11 can be operated, the unfolded state of the electric folding mirror can be secured. Therefore, the function of the electric folding mirror can be restricted from being impaired by a flow of an overcurrent.

Furthermore, a load short circuit may occur due to, for example, a short circuit of a connection portion of the load 12. For example, in a case where a load short circuit occurs when the electric folding mirror is in the unfolded state, even if the electric folding mirror is attempted to put into the folded state, an electric current is not supplied from the power source 50 to the motor 11. Thus, the motor 11 cannot be rotated in the reverse direction. However, since only the electric folding mirror cannot be put into the folded state while being in the unfolded state, the electric folding mirror does not affect a traveling of the vehicle. Conversely, in a case where a load short circuit occurs when the electric folding mirror is in the folded state, an electric current can be supplied from the power source 50 to the motor 11. Thus, the motor 11 can be rotated in the forward direction and the electric folding mirror can be put into the unfolded state. Therefore, even if a short circuit occurs on the upstream side of the load 12, the electric folding mirror can be put into the unfolded state, and the function of the electric folding mirror can be secured.

If a short circuit occurs on the upstream side of the load 12 in a case where the load 12 is connected to the first output terminal of the H bridge circuit 20, the motor 11 cannot be operated when it is desired to change from the folded state to the unfolded state. Therefore, when the motor 11 is applied to the electric folding mirror, it is preferable that the load 12 is connected to the second output terminal of the H bridge circuit 20.

When only the load 12 is operated, "(3) Load Operation" is performed. As a result, the forward rotation upstream MOS 21 and the reverse rotation upstream MOS 23 are turned on, the forward rotation downstream MOS 22 and the reverse rotation downstream MOS 24 are turned off, an electric current is supplied from the power source 50 to the load 12 while an electric current is not supplied to the motor 11. Therefore, only the load 12 can be operated.

Example 2

A circuit configuration of the load driving device according to Example 2 is similar to the circuit configuration shown in FIG. 1. In the present example, the motor 11 is applied as a washer motor for driving a pump of a washer device in the vehicle and the load 12 is applied as a washer nozzle heater for defrosting a washer nozzle. In the present case, the control ECU 10 corresponds to a wiper ECU, for example.

When an operation switch (not shown) is operated from a stop position to a first position, for example, the washer device performs washer injection from a front side device, and when the operation switch is operated to a second position, the washer device performs washer injection from a rear side device.

In the present case, the forward rotation upstream MOS 21 and the forward rotation downstream MOS 22 are turned on when the washer injection is performed from the front side device of the washer device to rotate the motor 11 in the forward direction. The reverse rotation upstream MOS 23 and the reverse rotation downstream MOS 24 are turned on when the washer injection is performed from the rear side device of the washer device to rotate the motor 11 in the reverse direction.

Since the operation of the washer device is visible, if the washer device is operated when the operation switch is not operated by a user, uncomfortable feeling may be given to the user. Therefore, the washer device is not operated when the operation switch is not operated by the user.

The washer nozzle heater defrosts an injection port of the front side device of the washer device. The washer nozzle heater is disposed in the vicinity of the injection port of the front side device, and is activated, for example, when an operation switch (not shown) is pressed.

Since it is difficult for the user to grasp an operating state of the washer nozzle heater, even if the washer nozzle heater is operated when the operation switch is not pressed, uncomfortable feeling is not given to the user.

When the motor 11 and the load 12 are applied to the washer device and the washer nozzle heater as described above, the following operation is performed.

First, in a case where washer injection is performed from the front side device of the washer device, the above-described "(1) Forward Rotation Operation" is performed. As a result, an electric current flows to the motor 11 in the first direction from the first output terminal to the second output terminal of the H bridge circuit 20, the motor 11 rotates in the forward direction, and the washer injection is performed from the front side device.

Since the load 12 is connected to the first output terminal of the H bridge circuit 20, an electric current is supplied from the power source 50 to the load 12 at the time. Therefore, the load 12 is also operated. However, as described above, in a case where the load 12 is the washer nozzle heater, even if the load 12 is operated in a state where the operation switch is not depressed, uncomfortable feeling is not given to the user. Therefore, there is no problem even if the load 12 is operated at the same time when the washer injection is performed from the front side device.

Next, in a case where washer injection is performed from the rear side device of the washer device, the above-described "(2) Reverse Rotation Operation" is performed. As a result, an electric current flows to the motor 11 in the second direction from the second output terminal to the first output terminal of the H bridge circuit 20, the motor 11 rotates in the reverse direction, and the washer injection is performed from the rear side device.

Since the load 12 is connected to the first output terminal of the H bridge circuit 20, an electric current is not supplied from the power source 50 to the load 12 at the time. Thus, the load 12 is not operated.

When only the load 12 is operated, "(3) Load Operation" is performed. As a result, the forward rotation upstream MOS 21 and the reverse rotation upstream MOS 23 are turned on, the forward rotation downstream MOS 22 and the reverse rotation downstream MOS 24 are turned off, an electric current is supplied from the power source 50 to the load 12 while an electric current is not supplied to the motor 11. Therefore, only the load 12 can be operated.

When the load 12 is grounded, the fuse 40 is blown, so that the current supply to the load 12 is interrupted. Even at this time, since the motor 11 is operable, the operation of the washer device can be ensured. Therefore, the function of the washer device can be restricted from being impaired by a flow of an overcurrent.

Modification of First Embodiment

Figure 4:
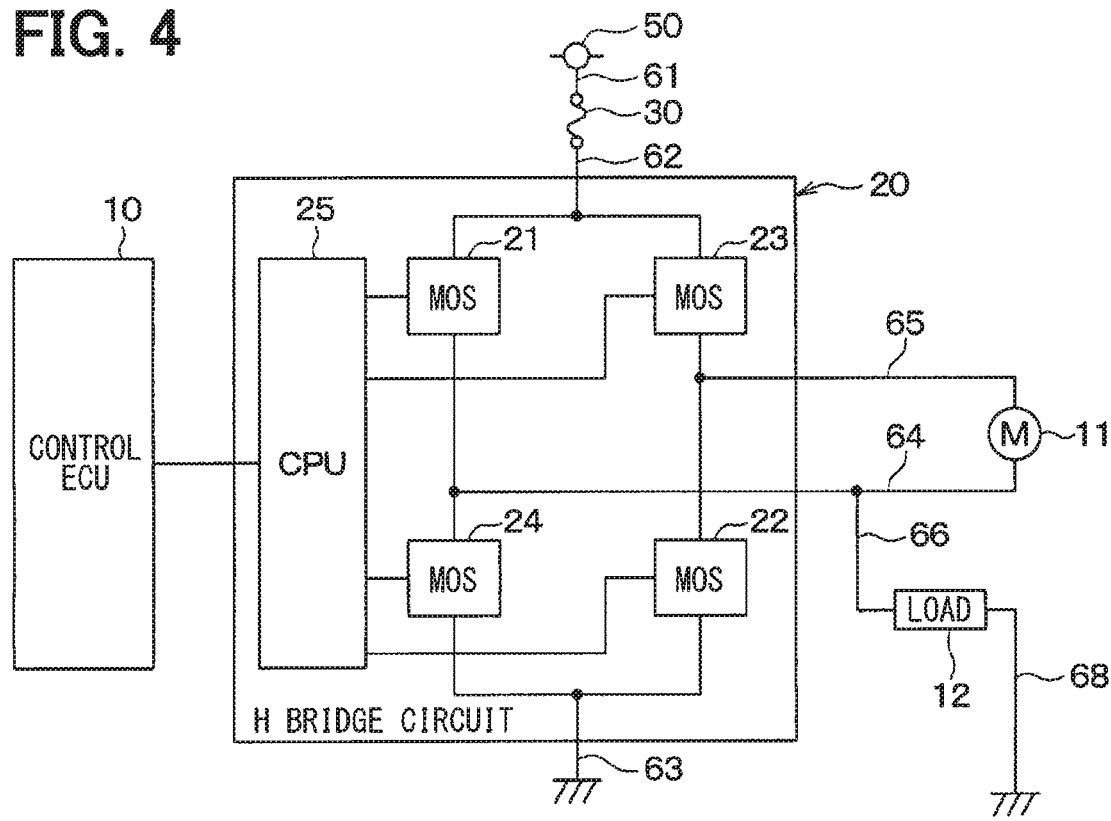
FIG. 4 is a circuit diagram showing a load driving device according to Example 2 of the first embodiment.

In the first embodiment, the fuse 40 is provided. However, the H bridge circuit 20 may have a fuse function based on the current detection function of the H bridge circuit 20. In that case, as shown in FIG. 4, there is no need to provide the fuse 40 and the wire harness 67 on the upstream side of the load 12. Therefore, the fuse 40 and the wire harness 67 can be further reduced in comparison with the first embodiment, the mounting area of the load driving device can be further reduced, the weight increase can be restricted, and the cost can be reduced.

Second Embodiment

A second embodiment will be described. Since the present embodiment is similar to the first embodiment except that the H bridge circuit 20 is replaced by a relay circuit, only portions different from the first embodiment will be described.

Figure 5:
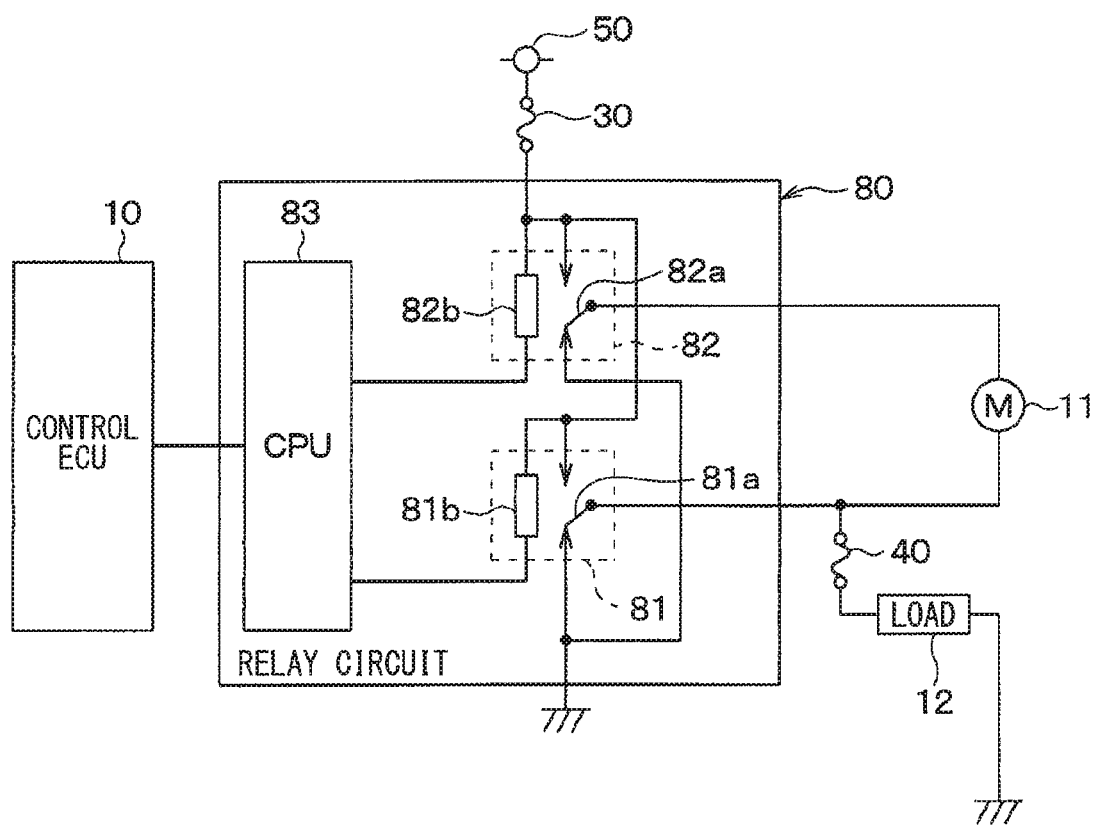
FIG. 5 is a diagram showing a circuit configuration of a load driving device according to a second embodiment.

As shown in FIG. 5, in the present embodiment, a relay circuit 80 is not formed of a semiconductor switching element but is formed of a mechanical relay. Specifically, the relay circuit 80 includes a first switching relay 81, a second switching relay 82, and a CPU 83. The CPU 83 outputs control signals for controlling the first switching relay 81 and the second switching relay 82.

One terminal of the motor 11 is connected to a first output terminal of the relay circuit 80 connected to a movable contact of the first switching relay 81, and the other terminal of the motor 11 is connected to a second output terminal of the relay circuit 80 connected to a movable contact of the second switching relay 82. The load 12 is connected to the first connection terminal or the second output terminal of the relay circuit 80 via the fuse 40. In the present embodiment, the load 12 is connected to the first output terminal.

The first switching relay 81 includes a switching switch 81a and a solenoid 81b. The second switching relay 82 includes a switching switch 82a and a solenoid 82b. Each of the switching switches 81a, 82a has a first contact, a second contact, and the movable contact. During a non-energizing time when the solenoids 81b, 82b are not energized, the movable contacts of the switching switches 81a, 82b are respectively connected to the first contacts as shown in FIG. 5, and the first switching relay 81 and the second switching relay 82 are turned off. During an energizing time when the solenoids 81b, 82b are energized, the movable contacts of the switching switches 81a, 82a are respectively connected to the second contacts, and the first switching relay 81 and the second switching relay 82 are turned on.

The load driving device having the above-described configuration is operated as follows.

(1) Forward Rotation Operation

During the forward rotation operation, the first switching relay 81 is turned on and the second switching relay 82 is turned off based on the control signals from the CPU 25. As a result, an electric current flows to the motor 11 in the first direction from the first output terminal to the second output terminal of the relay circuit 80, and the motor 11 is rotated in the forward direction.

Further, in the present embodiment, the load 12 is connected to the first output terminal of the relay circuit 80. Since the potential of the first output terminal becomes equal to the potential of the power source 50 during the forward rotation operation, an electric current is also supplied to the load 12 from the power source 50 so as to operate the load 12 simultaneously.

(2) Reverse Rotation Operation

During the reverse rotation operation, the first switching relay 81 is turned off and the second switching relay 82 is turned on based on the control signals from the CPU 25. As a result, an electric current flows to the motor 11 in the second direction from the second output terminal to the first output terminal of the relay circuit 80, and the motor 11 is rotated in the reverse direction.

During the reverse rotation operation, the potential of the second output terminal becomes the potential of the power source 50 while the potential of the first output terminal becomes the ground potential. Thus, an electric current is not supplied from the power source 50 to the load 12, and the load 12 is not operated.

(3) Load Operation

When the load is operated, both the first switching relay 81 and the second switching relay 82 are turned on. As a result, an electric current is supplied from the power source 50 to the load 12 via the first switching relay 81, and the load 12 is operated.

In the present case, since both the first switching relay 81 and the second switching relay 82 are turned on, the both ends of the motor 11 become the same potential. Therefore, only the load 12 is operated, and the motor 11 can be restricted from rotating in the forward direction or in the reverse direction.

As described above, even when the relay circuit 80 is formed of the first switching relay 81 and the second switching relay 82 which are mechanical relays, similar effects to the first embodiment can be obtained.

Other Embodiments

The present disclosure is not limited to the above-described embodiments and may be suitably modified.

For example, in the first embodiment, a MOSFET is taken as an example as a semiconductor switching element that forms each of the forward rotation upstream MOS 21, the forward rotation downstream MOS 22, the reverse rotation upstream MOS 23, and the reverse rotation downstream MOS 24. However, the MOSFET is just an example, and other semiconductor switching elements such as an insulated gate bipolar transistor (IGBT) can also be used.

In each of the above-described embodiments, the basic configuration of the circuit configuration of the load driving device is shown, but other elements such as resistors and capacitors may also be provided. For example, the load 12 is connected between the ground potential point and one of the first output terminal and the second output terminal, but other elements such as a resistor may be provided in addition to the load 12.

In the second embodiment, the H bridge circuit 20 in the first embodiment is replaced by the mechanical relay. However, the second embodiment can be applied to the electric folding mirror described in Example 1 or the washer device described in Example 2. In the present case, the connection modes of the motor 11 and the load 12 are similar to each example, and the first switching relay 81 and the second switching relay 82 may be driven as described in the second embodiment.

In the first embodiment, the motor 11 is taken as an example of the first load. Therefore, a first upstream switching element, a second upstream switching element, a first downstream switching element and a second downstream switching element forming the H bridge circuit 20 are respectively described as the forward rotation upstream MOS 21, the forward rotation downstream MOS 22, the reverse rotation upstream MOS 23, and the reverse rotation downstream MOS 24. However, the first load may be other than the motor 11. In such a case, in the circuit configuration shown in FIG. 1, when operating the first load, the first upstream switching element and the first downstream switching element are turned off while the second upstream switching element and the second downstream switching element are turned on. On the other hand, when operating the load 12 corresponding to the second load, the first upstream switching element and the second upstream switching element are turned on while the first downstream switching element and the second downstream switching element are turned off.

Also in the second embodiment, the motor 11 is taken as an example of the first load, but the first load may be other than the motor 11. Also in such a case, when operating the first load, the second switching relay 82 is turned on and the first switching relay 81 is turned off. On the other hand, when operating the load 12 corresponding to the second load, both the first switching relay 81 and the second switching relay 82 are turned on.

Accordingly, only the first load or the second load can be operated.

What is claimed is:

1. A load driving device configured to control operation of a first load and a second load, comprising:
   an H bridge circuit including a first upstream switching element, a first downstream switching element, a second upstream switching element, a second downstream switching element, a first output terminal between the first upstream switching element and the second downstream switching element, and a second output terminal between the second upstream switching element and the first downstream switching element, wherein
   the first load is connected between the first output terminal and the second output terminal of the H bridge circuit, and
   the second load is connected between a ground potential point and one of the first output terminal and the second output terminal,
   when the first load is operated:
      the first upstream switching element and the first downstream switching element are turned on, and the second upstream switching element and the second downstream switching element are turned off; or
      the second upstream switching element and the second downstream switching element are turned on, and the first upstream switching element and the first downstream switching element are turned off, and
   when only the second load is operated and the first load is not operated, the first upstream switching element and the second upstream switching element are turned on, and the first downstream switching element and the second downstream switching element are turned off.

2. The load driving device according to claim 1, further comprising
   a fuse via which the second load is connected to the one of the first output terminal and the second output terminal.

3. The load driving device according to claim 1, wherein
   the first load is a motor that rotates in a forward direction when an electric current flows in a first direction from the first output terminal to the second output terminal and rotates in a reverse direction when the electric current flows in a second direction from the second output terminal to the first output terminal.

4. The load driving device according to claim 3, wherein
   the motor is an electric folding motor that operates an electric folding mirror,
      the electric folding mirror is operated from a folded state to an unfolded state when the electric folding motor rotates in the forward direction, and the electric folding mirror is operated from the unfolded state to the folded state when the electric folding motor rotates in the reverse direction,
   the second load is a mirror heater provided to the electric folding mirror and is connected to the second output terminal,
   when the electric folding mirror is operated from the folded state to the unfolded state, the first upstream switching element and the first downstream switching element are turned on, and the second upstream switching element and the second downstream switching element are turned off to rotate the electric folding motor in the forward direction,
   when the electric folding mirror is operated from the unfolded state to the folded state, the second upstream switching element and the second downstream switching element are turned on, and the first upstream switching element and the first downstream switching element are turned off to rotate the electric folding motor in the reverse direction and to operate the second load.

5. The load driving device according to claim 3, wherein
   the motor is a washer motor that drives a pump in a washer device,
   the washer device performs washer injection from a front side device when the washer motor rotates in the forward direction, and the washer device performs water injection from a rear side device when the washer motor rotates in the reverse direction,
   the second load is a washer nozzle heater for defrosting a washer nozzle in the washer device and is connected to the first output terminal,
   when the washer device is operated to perform washer injection from the front side device, the first upstream switching element and the first downstream switching element are turned on, and the second upstream switching element and the second downstream switching element are turned off to rotate the washer motor in the forward direction and to operate the second load,
   when the washer device is operated to perform washer injection from the rear side device, the second upstream switching element and the second downstream switching element are turned on, and the first upstream switching element and the first downstream switching element are turned off to rotate the washer motor in the reverse direction.

6. A load driving device configured to control operation of a first load and a second load, comprising:
   a relay circuit including a first switching relay, a second switching relay, a first output terminal, and a second output terminal, each of the first switching relay and the second switching relay including a switching switch having a first contact, a second contact, and a movable contact, and a solenoid connecting the movable contact to the first contact during a non-energizing time and connecting the movable contact to the second contact during an energizing time, the first output terminal connected to the movable contact of the first switching relay, and the second output terminal connected to the movable contact of the second switching relay, wherein
   the first load is connected between the first output terminal and the second output terminal of the relay circuit, and
   the second load is connected between a ground potential point and a connection terminal that is provided between the movable contact of the first switching relay and the first load, or between the movable contact of the second switching relay and the first load.

7. The load driving device according to claim 6, wherein
   when the first load is operated:

the first switching relay is turned on and the second switching relay is turned off; or the second switching relay is turned on and the first switching relay is turned off, and when the second load is operated, both the first switching relay and the second switching relay are turned on.

\* \* \* \* \*